United States Patent [19]

Shott et al.

[11] 4,152,678
[45] May 1, 1979

[54] CASCADE CHARGE COUPLED DELAY LINE DEVICE FOR COMPOUND DELAYS

[75] Inventors: John D. Shott, East Palo Alto; Roger D. Melen, Palo Alto; James D. Meindl, Los Altos, all of Calif.

[73] Assignee: Board of Trustees of the Leland Stanford Jr. Unv., Stanford, Calif.

[21] Appl. No.: 701,519

[22] Filed: Jul. 1, 1976

[51] Int. Cl.² .................. H03H 7/20; H03H 7/30; H03K 17/56; H01L 29/78

[52] U.S. Cl. ........................ 333/150; 73/619; 73/641; 128/660; 307/221 D; 333/165; 340/5 MP

[58] Field of Search .............. 333/29, 70 R, 70 T; 357/24, 26; 307/221 D, 221 R, 221 C; 340/5 MP, 6 R, 15.5 DS; 73/603-625, 641-642; 310/334-335

[56] References Cited

U.S. PATENT DOCUMENTS

| | | | |
|---|---|---|---|
| 3,914,748 | 10/1975 | Barton et al. | 357/24 X |
| 3,918,024 | 11/1975 | Macovski | 340/5 MP |
| 3,919,468 | 11/1975 | Weimer | 307/221 D X |
| 3,940,602 | 2/1976 | Lagnado et al. | 364/826 X |
| 3,942,035 | 3/1976 | Buss | 340/10 |
| 3,944,850 | 3/1976 | Walden | 307/221 D |
| 4,005,382 | 1/1977 | Beaver | 340/6 R X |

OTHER PUBLICATIONS

Tompsett et al., "Use of Charge-Coupled Devices for Delaying Analog Signals" in IEEE Journal of Solid-State Circuits, Apr. 1973; pp. 151–157.

*Primary Examiner*—Alfred E. Smith
*Assistant Examiner*—Marvin Nussbaum
*Attorney, Agent, or Firm*—Flehr, Hohbach, Test, Albritton & Herbert

[57] ABSTRACT

A cascade charge coupled delay circuit including a plurality of serial delay line sections formed on a single semiconducter wafer, said delay line sections being directly coupled to one another through the wafer and means for independently clocking each section of said lines.

11 Claims, 7 Drawing Figures

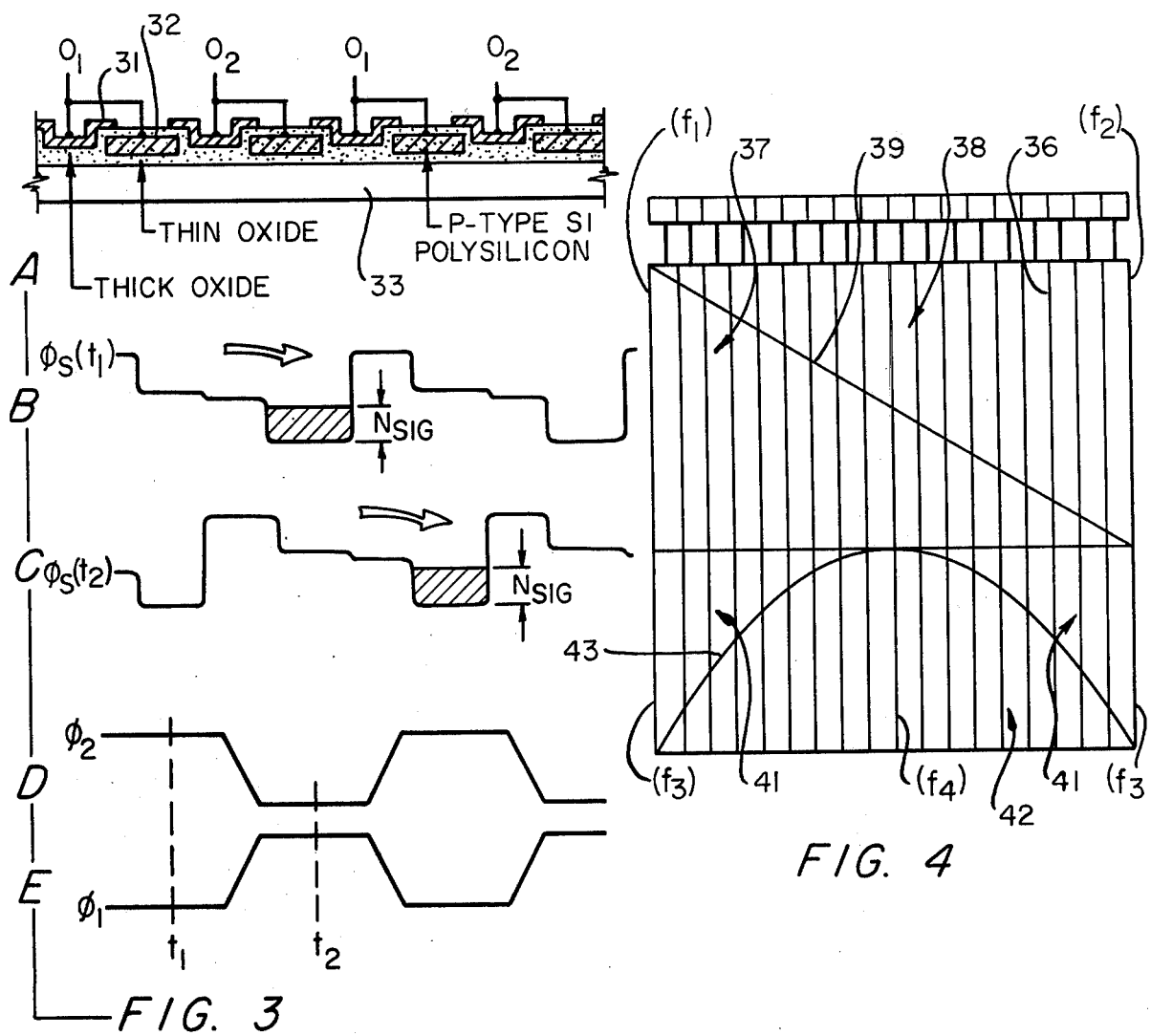
FIG. 3
FIG. 4
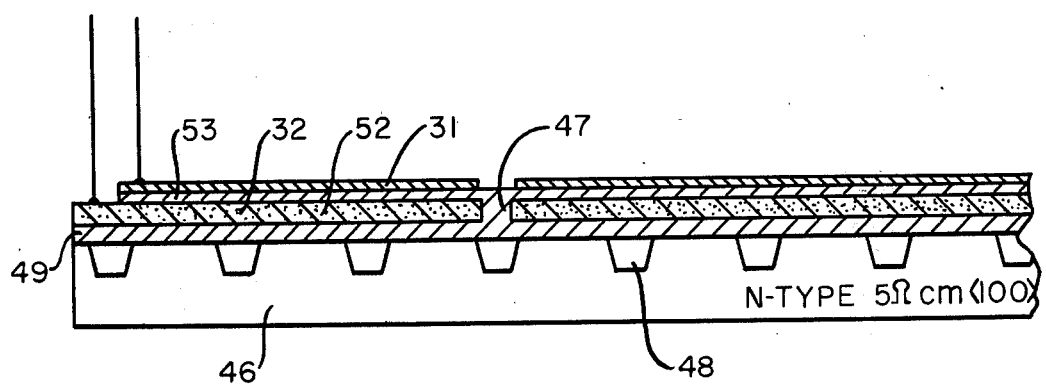
FIG. 6

CASCADE CHARGE COUPLED DELAY LINE DEVICE FOR COMPOUND DELAYS

GOVERNMENT CONTRACT

This work was performed under a grant by the National Institutes of Health, Grant No. NIH-5P01-GM-17940-05.

BACKGROUND OF THE INVENTION

Ultrasonic imaging systems are currently in use in a variety of medical and material testing applications. Several such systems include single transducers which are manually or mechanically scanned over the region to be observed. Electronic circuits serve to energize the transducer to isonify the object being scanned and to receive energy reflected from the object, generate representative signals, process the signals, and provide a visual display of the region being scanned. For example, the display may include a sector scan in which the various acoustic interfaces are displayed in a sector which corresponds to the sector being scanned.

More recently, ultrasonic scanning systems based upon the use of arrays of transducer elements rather than a single element have been developed. Such systems do not require mechanical or manual movement of the ultrasonic transducer. Among the latter developments have been systems which include a linear array of transducers which is electronically scanned to steer or direct the emitted ultrasonic wave front in a particular direction.

Received reflected energy at each of the transducers is then resolved by a system of electronically variable delays. Systems of this type lack good lateral resolution. F. L. Thurstone and O. T. von Ramm in their article entitled, "A New Ultrasonic Imaging Technique Employing Two-Dimensional Electronic Beam Steering", published in Acoustical Holography Vol. 5, Proceedings of the Fifth International Symposium on Acoustical Holography, 1974, Plenum Press, New York, describe an improvement in systems of the foregoing type. Thurstone, in addition to the electronic sector scan, use electronic focusing in the plane of the scan. This improves lateral resolution in the plane of the scan but results in no improvement in lateral resolution orthogonal to the scanned plane. Each of the transducer elements includes a separate amplifier, logarithmic compressor, variable delay line, and transducer associated therewith. Beyond the use of electronic focusing of received signal per se, some additional lateral resolution in the plane of the scan is achieved by multiplying the signals of the individual elements by using an aspheric curve for the transmit beam. This makes the system nonlinear so that undesired artifacts can be generated. The delay lines are lumped constant LC circuits with transistors taps controlled by computer. Systems of this type are rather complex and expensive.

Recent developments in the semiconductor field have offered improved delay lines known as charge coupled delay lines (CCD). However, when these delay lines are substituted for the prior art delay lines, electronic circuits must be employed to interconnect the charge coupled delay lines. A large amount of electronics is required for such systems.

The prior art does not teach compact, simple, inexpensive electronic untrasonic scanning systems.

BRIEF DESCRIPTION OF FIGURES

FIG. 3 is a sectional view illustrative of the operation of a charge coupled delay line.

FIG. 4 is a schematic diagram of a cascade charge coupled delay line device for compound delays.

FIG. 6 is a sectional view taken along the line 6—6 of FIG. 5.

OBJECTS AND SUMMARY OF THE INVENTION

It is a general object of the present invention to provide a compact, simple, inexpensive cascade charge coupled delay line structure for providing compound delays.

It is another object of the present invention to provide a cascade charge coupled structure formed as a monolithic structure to provide compound delays.

It is still another object of the present invention to provide a compact, simple, inexpensive cascade charge coupled delay line structure for focusing and steering an array of ultrasonic transducers.

It is a further object of the present invention to provide a plurality of serially connected charge coupled delay lines coupled through a semiconductor wafer.

The foregoing and other objects of the invention are achieved by a charge coupled delay circuit including a plurality of charge coupled delay line sections formed on a single semiconductor wafer, said sections being directly coupled to one another through said wafer, and means for independently connecting to each of said line sections for independently applying clocking signals thereto.

BRIEF DESCRIPTION OF PREFERRED EMBODIMENT(S)

Figure 1:
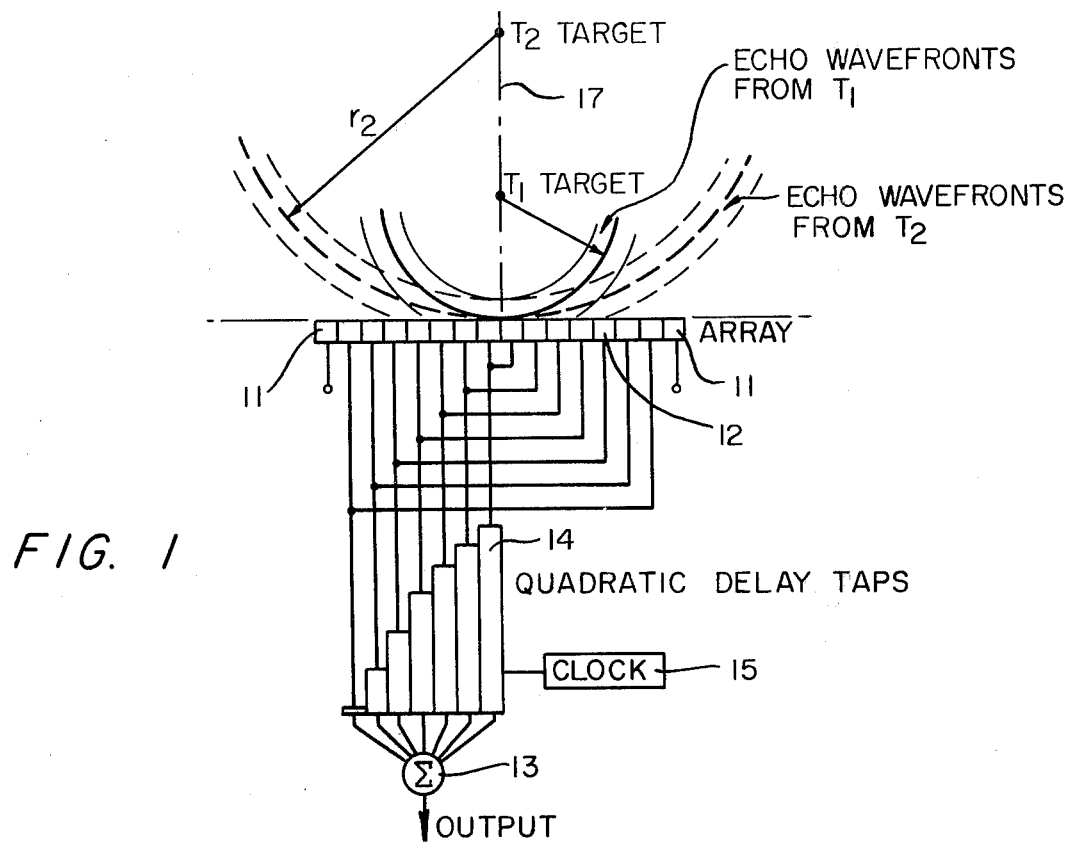
FIG. 1 shows an acoustic imaging array having dynamic focusing with a quadratically tapped variable delay line.

Referring to FIG. 1, there is shown charged couple devices (CCD) delay lines associated with an array of transducers to provide an electronically focused ultrasonic imaging system. Briefly stated, the CCDs act as an electronically adjusted delay line performing the required delay and summation on the received ultrasonic signals. This capability makes economically feasible an ultrasonic imaging system having high resolution, dynamic focusing and adjustable field of view.

In operation, a burst of ultrasonic energy is transmitted from a pair of transducers 11 located at each end of the transducer array 12. The burst of energy may be suitably generated by gating or othersise applying electrical energy at the proper frequency simultaneously to the end transducers 11 whereby they emit a wavefront of ultrasonic energy which travels from the transducers towards the "target" to be observed. Reflections from targets, for example $T_1$ or $T_2$, return to the array 12 arriving at the elements with a spherical time delay distribution associated with the target range. The farther away the target the smaller the time delay between the elements. The basic signal processing task to be performed by the delay line 14 is to equalize the total propagation time from the target through the medium, piezoelectric transducer and individual channel electronics to the common signal output summing mode 13. This can be accomplished by spacing the input taps of the CCD delay lines 14 in a quadratic arrangement and dynamically sweeping the clock frequency 15 to control the curvature of the quadratic delay to complement the curvature of the spherical wavefronts from the targets $T_1$ and $T_2$ and beyond. This permits significant improvement in resolution at ranges of less than ten times the aperture of the system.

Figure 2:
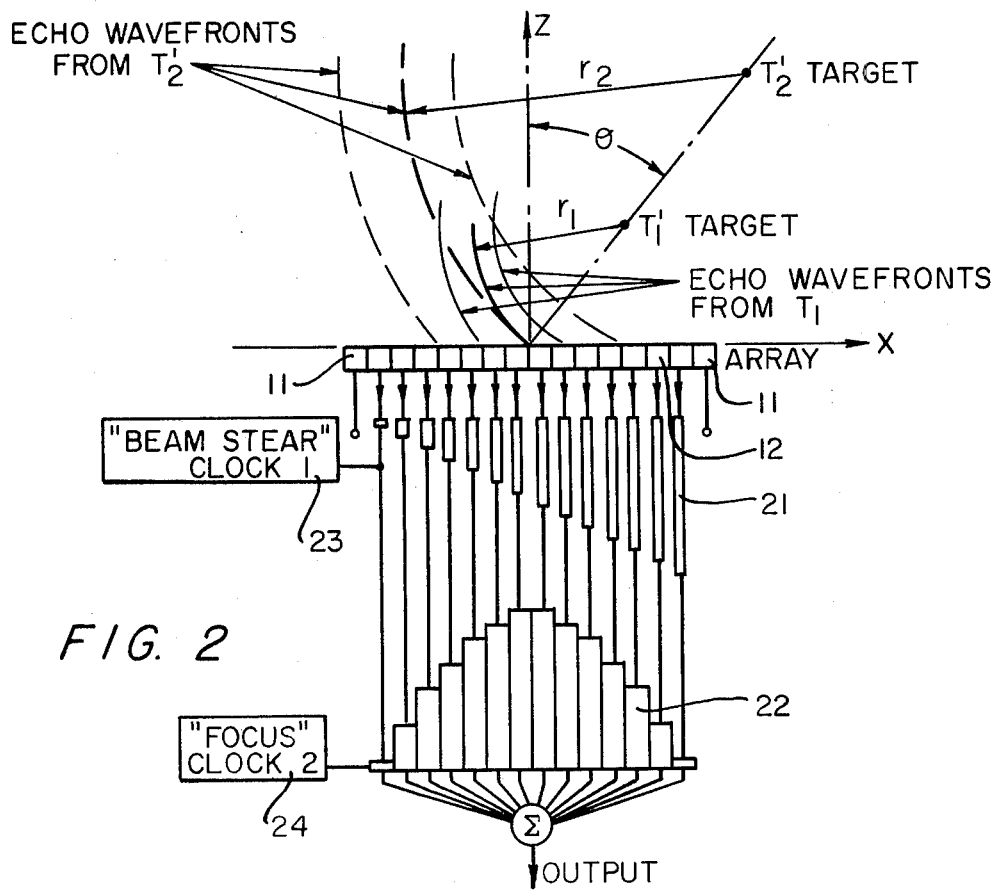
FIG. 2 shows an acoustic imaging array having dynamic focusing with beam steering.

In the system FIG. 1, the CCD delay lines are connected to the transducer elements on each side of the symmetrical center and thereby focusing can only be achieved along the Z axis 17. It is desirable in ultrasonic imaging systems to be able not only to focus along the axis but also scan so that the axis can be tilted or steered whereby the focal point can be directed anywhere in front of the array. Such a system is shown in FIG. 2. The system utilizes a linear array 12, a linear delay distribution provided by CCDs 21 in connection with a quadratic distribution provided by CCDs 22 to steer the focused beam providing two-dimensional display information. This is a simple steering technique which allows the deflection of the formed beam in one direction from the perpendicular. Typical systems may be designed for thirty to forty-five degrees deflection. In operation, the linear array CCDs 21 electronically rotate the piezoelectric array thereby providing the quadratic delay line with a focus at an angle with respect to the Z-axis. A minor difference in focusing is that the apparent range for focusing is larger than the range to the Z-axis due to the "electronic rotation" being about the point of zero time delay. The clock 23 serves to control the steering while the clock 24 serves to control the focal point so that the beam is focused at $T_1'$ or $T_2'$. Thus, there is described in FIG. 2 dynamic focusing and beam steering employing charge coupled delay lines.

Charge couple delay lines have been referred to above. A more complete description of such devices is presented in connection with FIGS. 3A through 3E. Referring to the figures, it is seen that the CCD is a series or string of metal oxide semiconductors (MOS) capacitors with separate upper electrode pairs 31, 32 and a bottom silicon electrode 33 common to all capacitors. Transfer of signal charge packets of arbitrary size between adjacent capacitors is accomplished by reducing the potential (i.e., by a first clock voltage as shown in FIG. 3E) of alternate upper electrode pairs while simultaneously increasing the potential (i.e., by a second clock voltage as shown in FIG. 3D) on adjacent upper electrode pairs. As these electrode potentials switch, corresponding changes in the silicon surface potentials cause a lateral signal charge transfer as illustrated in FIG. 3B and 3C. The salient features of the CCD electronic delay lines are the following: (a) delay time ($t_d$) can be varied electronically by simply changing the clock frequencies; (b) delay time is the product of the number of pairs of stages and the clock frequency and therefore can be extended by increasing the number of stages; (c) high charge transfer efficiency between adjacent electrodes; (d) large transfer efficiency at clock frequencies of 10 MHz and above (which is required to permit wideband signals to be delayed; (e) large dynamic range; and (g) low cost due to the fact that entire arrays of CCD delay lines can be fabricated as a monolithic silicon integrated circuit, as will be presently described.

Dynamic focusing and steering were described above in reference to FIGS. 1 and 2. This can be accomplished by changing the clock frequencies 15, 23 and 24 respectively. Changing the clock frequency 23 changes the value of the scan angle for beam steering to the right of the Z-axis Changine the clock frequencies 15, 24 changes the focal distance.

In accordance with the present invention, there is provided monolithic array of CCD delay lines which not only provides beam steering on both sides of the Z-axis, but also serve to provide infinite focusing along the direction of the beam. In FIG. 4 there is schematically shown such a system. The focusing and steering is achieved by applying appropriate clock frequencies to the CCD delay lines delineated by the vertical lines 36 forming the steering sections 37 and 38 delineated by the line 39 and the focusing sections 41 and 42 delineated by the quadratic curve 43. For example, if the clock frequencies ($f_1$) and ($f_2$) are equal, the scan angle is zero. However, if ($f_2$) is less than ($f_1$), the beam is steered toward the far left, and if ($f_1$) is less than ($f_2$), the beam is steered toward the right. By employing two sets of quadratically tapered delay lines 38 and 39 with separate clock frequencies ($f_3$) and ($f_4$) applied, focusing or parabolic delay equalization for a spherical wavefront may be obtained.

Figure 5:
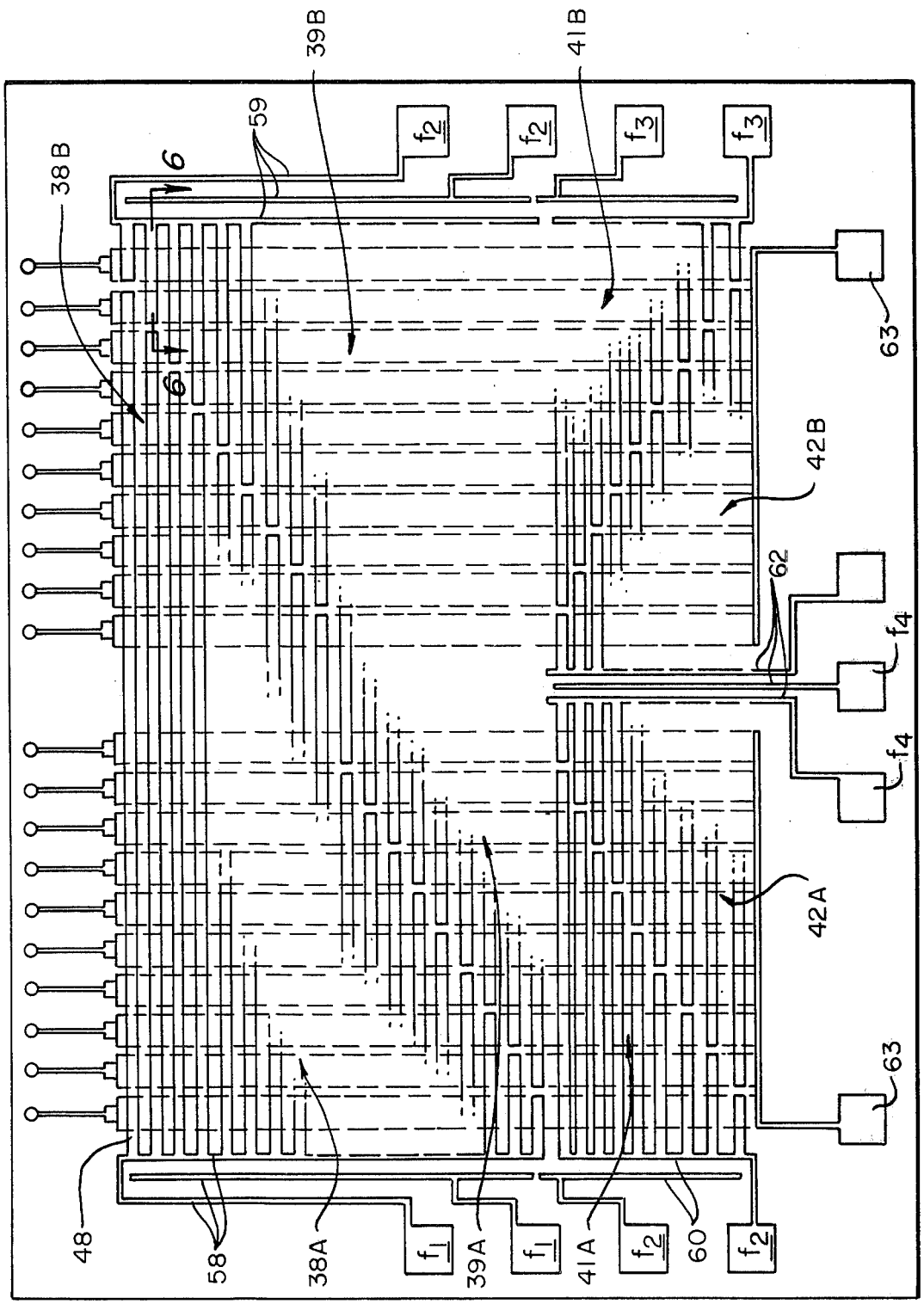
FIG. 5 is a plan view of a cascade charge coupled delay line device with compound delays formed in a single substrate.
Figure 7:
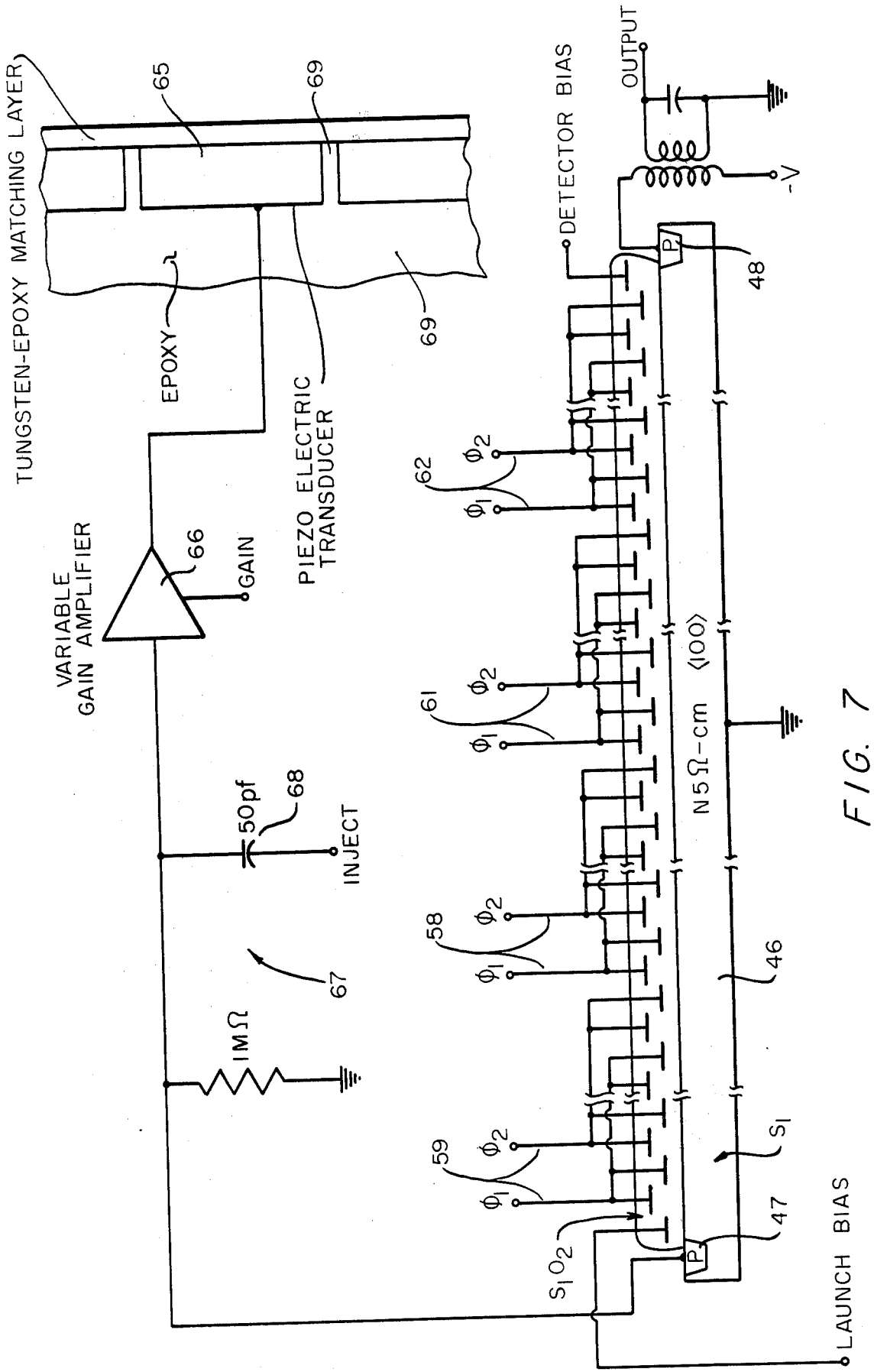
FIG. 7 is a schematic circuit diagram of a single cascaded charge coupled delay line providing four compound delays connected to a single transducer of an acoustic imaging array.

A monolithic CCD lens array in accordance with the foregoing is more clearly illustrated in FIGS. 5, 6 and 7. The array comprises a silicon wafer 46 for example N-type 5 ohm centimeter, <100> cut as shown in FIGS. 5–7. The array configuration is shown in FIGS. 5 and 6. The array is formed generally in accordance with the following procedure. An oxide masked diffusion of boron into the N-type substrate forms P-type regions 47 and 48 of the input and output MOS transistors, FIG. 7. Next the oxide is stripped and replaced by a clean oxide mask for a phosphorous diffusion. The phosphorous diffusion is used to define regions 48, FIG. 6, which delineate longitudinal CCD delay lines. These N-type regions act as regions of relatively high potential and are used to delineate the edges of the charged storage regions for each of the longitudinal delay lines.

The oxide is removed and the lower level capacitor oxide 49, FIG. 6, is thermally grown and then the lower electrode polycrystalline silicon 52, FIG. 6, is formed by chemical vapor deposition uniformly on the surface. The polycrystalline silicon 52 is then doped N-type in an unmasked phosphorus diffusion. Excess polycrystalline silicon is removed through the standard integrated circuit photolithographic and etching techniques to form transverse electrode 32. An upper layer 53 of oxide is pyrolitically deposited on the surface of the structure. Openings are then etched through the oxide layer where necessary to contact the out-put circuitry. Aluminum is evaporated on the surface in a contaminate free vacuum furnace and delineated using standard photolithographic and etching techniques to form the electrodes 31 FIG. 3 and to make contact to the electrode of 32, FIG. 3. The finished devices are annealed at 450° C. to provide contact of the aluminum layers with the underlying semiconductor layers. The transverse leads 31 and 32 are terminated to form the boundaries 39 and 43.

Referring now particularly to FIG. 5 the lens is seen to include the two tapered regions 38 and 37 each including sections 38A, 38B and 39A and 39B respectively. These sections are directly connected to quadratic sections 41A, 41B which in turn are connected to an integrating section 42A, 42B. Pairs of leads 58 are connected to the polycrystalline and conductive electrodes of the first tapered section while pairs of leads 59 are connected to the second tapered section. The leads are provided with the clocking voltages to clock the charges down the delay lines of each section. Similarly, pairs of electrodes 60 are employed to clock the quadratic delay line, while a pair of leads 62 are employed to clock the summing section of the charge coupled device. The summing section connections are made at the center and extend outwardly as shown. Electrodes 63 are supplied at the end of the integrating section to receive the signals therefrom.

In FIG. 7 the electrical connections to the delay lines are schematically shown connected to one piezoelectric transducer 65 via a variable gain amplifier 66 capacity coupling network 67 and injection capacitor 68 and is connected to input lead of launch MOS 47. The output is obtained at the output MOS 48 and applied to a transformer coupled output. The piezoelectric transducer is shown in a substrate 69 which included tungsten epoxy on the surface as a matching layer to the body and embedded in epozy material for maintaining each of the individual transducers 65 adjacent to one another.

The monolithic lens described is a two-phased surface channel device including 20 inputs which inject charge into twenty distinct delay sections which are clocked at frequencies $f_1$ and $f_2$ to provide the steering as previously described. At the end of each delay section the charge is transferred directly to the next serial delay section. The quadratic delay lines are energized at a frequency $f_3$ to provide the focusing. The output of these delay line sections is directly coupled to integrating delay sections driven at frequency $f_4$ which serve to sum the output and provide an output at the leads 63.

It should be emphasized that the charge reaching the end of any delay section 38, 37 and 41 respectively is shifted into the next delay section 37, 41, and 42 respectively by charge transfer. This technique has the distinctive advantage of eliminating the need for sixty sets of charge extractions, signal recovery and charge reinjection circuitry, and represents a substantial savings in terms of chip area, power transmission, and off chip circuitry.

The direct cascade scheme of the present invention complicates the frequency spectrum of the charge coupled delay lines by resampling a sampled analog signal. The additional spectral components are found to be at the fundamental and higher harmonics of the difference frequency between clocks $f_1$ and $f_2$ and $f_3$ and $f_4$. These difference frequency components arise because the transfer of charge across the $f_2/f_1$ boundary is sensitive to the phase of $f_1$ relative to $f_2$ and to the transfer of charge across the $f_4/f_5$ boundary is sensitive to the phase of $f_3$ relative to $f_4$. This results in the non-uniform distribution of the originally uniform fat-zero charge which then appear as an additional output signal component. However, careful system design and appropriate selection of clock frequencies can prevent these additional signal components from interfering with the desired signal spectrum. For example, in the case of 1.5 MHz ultrasound, the selection of clock frequencies which are integer multiples of 1 MHz insures that the frequency band 0.6 MHz wide centered at 1.5 MHz will have no non-signal components in it.

Thus, there is described an improved ultrasonic imaging system employing a plurality of transducers coupled to a plurality of serially connected directly coupled charge coupled delay lines formed on a single monolithic substrate.

What is claimed is:

1. A cascade charge coupled circuit including a plurality of charge coupled delay line sections each including a plurality of charge coupled delay lines of different length formed on a single semiconductor wafer and each delay line directly serially coupled to one another through said wafer and means connected to each said delay line sections for applying independent clocking signals thereto.

2. A cascade charge coupled circuit including a plurality of adjacent charge coupled delay circuits formed on a single semiconductor wafer disposed parallel to one another, each of said delay circuits including a plurality of charge coupled delay line sections serially coupled to one another through said wafer, at least some of the delay circuits having sections of different length, and means connected to each of said serially coupled sections of adjacent circuits of said plurality of charge coupled delay line circuits to independently control the transfer of charge along each of the sections of adjacent delay line circuits.

3. A cascade charge coupled circuit including a plurality of adjacent charge coupled delay circuits formed on a single semiconductor wafer and disposed parallel to one another, each of said circuits including at least two charge coupled delay line sections serially connected to one another through said wafer with sections of adjacent circuits being of different lengths, means connected to each of said serially coupled sections of adjacent circuits of said plurality of charge coupled delay line circuits to independently control the transfer of charge along each of the sections of adjacent delay line circuits.

4. A cascade charge coupled circuit as in claim 3 wherein the length of said sections of adjacent charge coupled delay circuits varies parabolically.

5. A cascade charge coupled circuit as in claim 3 wherein each of said adjacent charge coupled delay circuits includes four sections serially coupled to one another through said wafer.

6. A cascade charge coupled delay circuit as in claim 5 wherein the length of two of said sections of adjacent delay circuits varies parabolically and the length of the other two of said adjacent delay line circuits varies linearly.

7. An acoustic imaging system including a plurality of adjacent acoustic transducers, a plurality of charge coupled delay circuits one connected to each of said transducers, said plurality of charge coupled delay circuits formed adjacent and parallel to one another on a single semiconductor wafer, each of said circuits including a plurality of charge coupled delay line sections serially coupled to one another through said wafer and means connected to adjacent sections of said plurality of adjacent charge coupled delay circuits for independently controlling the transfer of charge along adjacent sections of each of said charge coupled delay circuits.

8. A cascade charge coupled delay circuit as in claim 7 wherein each of said adjacent circuits includes at least two serial charge coupled delay line sections with sections of adjacent charge coupled circuits being of different length.

9. A cascade charge coupled delay circuit as in claim 8 wherein the length of said adjacent delay line sections varies parabolically to thereby provide focusing of the transducer ray.

10. A cascade charge coupled delay circuit as in claim 7 wherein each of said parallel charge coupled delay circuits includes four sections and means for independently controlling the transfer of charge along each section.

11. A charge coupled delay circuit as in claim 10 wherein the length of two of said sections of each of the adjacent parallel circuits is varied parabolically to thereby control the length of focusing and the other two of the said sections are varied linearly to provide beam steering.

* * * * *